United States Patent [19]

Smith et al.

[11] Patent Number: 5,493,165
[45] Date of Patent: Feb. 20, 1996

[54] FORCE GENERATOR FOR ELECTROSTRICTIVE ACTUATORS

[75] Inventors: Thomas E. Smith, Morris County; Robert Zappulla, Lebanon; George G. Zipfel, Jr., Summit, all of N.J.

[73] Assignee: AT&T Corp., Murray Hill, N.J.

[21] Appl. No.: 335,213

[22] Filed: Nov. 4, 1994

Related U.S. Application Data

[63] Continuation of Ser. No. 136,061, Oct. 14, 1993, abandoned.
[51] Int. Cl.⁶ .................................................. H01L 41/08
[52] U.S. Cl. .................................................. 310/328; 310/366
[58] Field of Search ................................. 310/323, 325, 310/328, 366, 340

[56] References Cited

U.S. PATENT DOCUMENTS

| | | | |
|---|---|---|---|
| 3,521,090 | 7/1970 | Angeloff | 310/328 |
| 4,618,797 | 10/1986 | Cline | 310/339 |
| 4,680,595 | 7/1987 | Cruz-Uribe et al. | 346/140 R |
| 4,761,582 | 8/1988 | McKee | 310/339 |
| 4,978,881 | 12/1990 | Wakita et al. | 310/328 |
| 5,271,133 | 12/1993 | Dam et al. | 310/328 X |

FOREIGN PATENT DOCUMENTS

| | | | |
|---|---|---|---|
| 0199074 | 9/1987 | Japan | 310/366 |
| 0049482 | 2/1990 | Japan | 310/328 |

*Primary Examiner*—Mark O. Budd
*Attorney, Agent, or Firm*—Charles E. Graves; Martin I. Finston

[57] ABSTRACT

This disclosure describes a method for producing high-performance layered-element electrostrictive or piezoelectric actuators, and the resulting product. The process calls for steps that minimize decreases of the stack stiffness which usually characterize layered wafer actuators. These include making the wafers flat and parallel, using a referred wafer metalization process that does not affect wafer surface roughness, and using stock-bonding epoxies with viscosities which readily permit the bonding agent to "wick" into the interface areas of the wafer/electrode stacks thereby to minimize the bond agent thickness.

4 Claims, 3 Drawing Sheets

FORCE GENERATOR FOR ELECTROSTRICTIVE ACTUATORS

GOVERNMENT INTEREST

The Government has rights in this invention. Work was funded under Government Contract No. N00014-90-C-0258. This application is a continuation of application Ser. No. 08/136,061, filed on Oct. 14, 1993, now abandoned.

FIELD OF THE INVENTION

This invention relates to electro-mechanical transduction devices and particularly to a method for producing high-performance layered-element electrostrictive or piezoelectric actuators and the resulting product.

BACKGROUND OF THE INVENTION

In the field of transduction, actuators are used to apply a force to a surface. In high performance applications where size and weight are at a premium, this type of actuator requires a high-power transfer efficiency. Such applications include, for example, sonar transmitters or projects, vibration control actuators, micropositioners, valves, deformable mirrors, and linear motors.

Electrostrictive or piezoelectric actuators occasionally have been employed in these applications. Such actuators, fabricated for example of disc components made of lead-magnesium-niobate ceramic system (PMN), are especially useful because of their excellent transduction characteristic.

The typical PMN actuator design of the prior art has not, however, taken advantage of the full work output of the electrostrictive elements for low drive voltages. Attempts to increase output have not been successful. For low-frequency broadband applications, efficient utilization of the material requires directly coupled amplifiers, as transformer-coupled amplifiers are typically large and heavy. Maximum output from a PMN element, for example, requires that the drive voltage be comparable to the element's breakdown voltage.

In efforts to increase the performance of PMN electrostrictive actuators, little attention has been given to the optimizing of the multi-wafer structure particularly to maximize stiffness and the critical role which the production process plays.

More specifically, since the maximum practical direct coupled drive voltage is on the order of 1000 volts and typical breakdown voltages are 50 volts per mil, it follows that the drive element ought to be as thin as possible, such as 0.020 mils or less in thickness. In order, therefore, to achieve a large power output, large stacks containing on the order of 100 elements are built. Heretofore, the fabrication of these stacks has been directed to end uses in displacement applications. For high power coupling efficiency, both the force and the displacement need to be high.

Thus, in order to realize a given force output from thin wafers the deleterious effects of slicing the bulk material into thin wafers and the consequent interface stiffness in a stack must be overcome. Further, in order to achieve the optimum power output, high stack stiffness as well as large cross-sectional area are required.

OBJECTS OF THE INVENTION

Accordingly, one object of the invention is to increase the output of electrostrictive actuators.

Another object of the invention is to avoid the need for using undesirably high electrical drive voltages in increasing output of electrostrictive actuators.

A further object of the invention is to use smaller actuators for the same force output.

SUMMARY OF THE INVENTION

These and other objects are achieved in accordance with the invention by realizing a novel actuator structure in which mechanical losses within the actuator stack are significantly reduced.

In general, this invention is a process, and the resulting product (i.e., actuator), for fabricating stacks of wafer elements with a stiffness that is comparable to the bulk material itself that is used as the material for the slices of the stack.

In accordance with another aspect of the invention, the surface properties of the actuator components particularly the wafers are controlled.

Further, by minimizing the thickness of low stiffness layers such as the glueline and by controlling the final actuator assembly to maximize interlayer contact, losses within the actuator layers stack are reduced to levels where they do not limit device performance.

A process for building the novel actuator layered-element stack is provided which controls all the important aspects of the fabrication and assembly of the stacks to maximize the output of the actuator. These and other aspects, features and advantages of the invention will be apparent from a reading of the description to follow of an illustrative embodiment thereof.

DETAILED DESCRIPTION OF AN ILLUSTRATIVE EMBODIMENT

Figure 1:
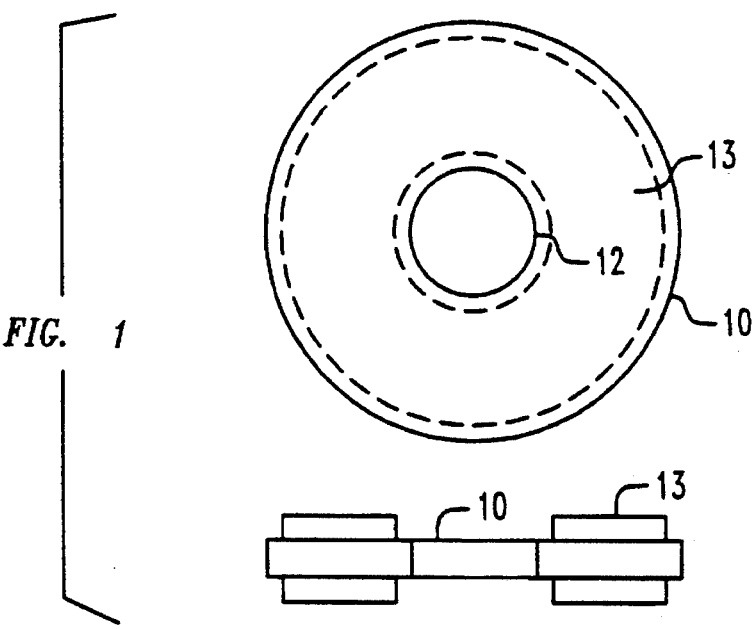
FIG. 1 is a top and side view of a metallized wafer.

FIG. 1 portrays a metallized wafer which is the elemental building block of the stacks to be described. It should be noted the greatest force that an actuator can provide is that obtained from a solid slug of piezoelectric or magnetostrictive material. Slicing the material into wafers to reduce the level of needed operating voltages and then stacking the wafers has the undesired effect of reducing the force output because of losses of stiffness relative to the bulk material exhibited by a solid column or slug. By practicing the process described below, the resulting stack is surprisingly close in stiffness to the solid slugs of the same material: 22,000,000 lbs./in vs. 16,000,000 lb./in. exhibited by a stack of 0.018 mil wafers.

In accordance with the invention, an exemplary starting material for fabricating the wafers advantageously is a sintered powder of PMN or other material. The grain size of the starting powder must be selected to advantageously provide a material modulus of in the vicinity of at least 7.99 million pounds per square inch. Smaller grain size tends to reduce possible voids and void sizes in the resulting material, which is important in achieving stiff material for maximum force output.

The powder is mixed with a conventional binder and thereafter is isostatically pressed to form a boule. The boule is then fired in a kiln. Advantageously, the boule is either formed with a center hole or the wafers 10 are later formed with a center hole such as is denoted 12 in FIG. 1. The boule then is sliced into wafers, denoted 10 in FIG. 1 which individually are about 18 mil thick.

In order to avoid a decrease in contact stiffness that can be brought about by increasing the number of wafer-to-wafer interfaces in the stack, it is necessary to make the wafers as flat and parallel as possible in the slicing process and to maintain the opposite surfaces parallel. To this end it has been determined that a diamond inside diameter (ID) saw is advantageous to do the slicing. This slicing technique is important to the overall process because it produces a smooth surface measuring approximately 5 microinches on the $R_a$ scale.

Figure 2:
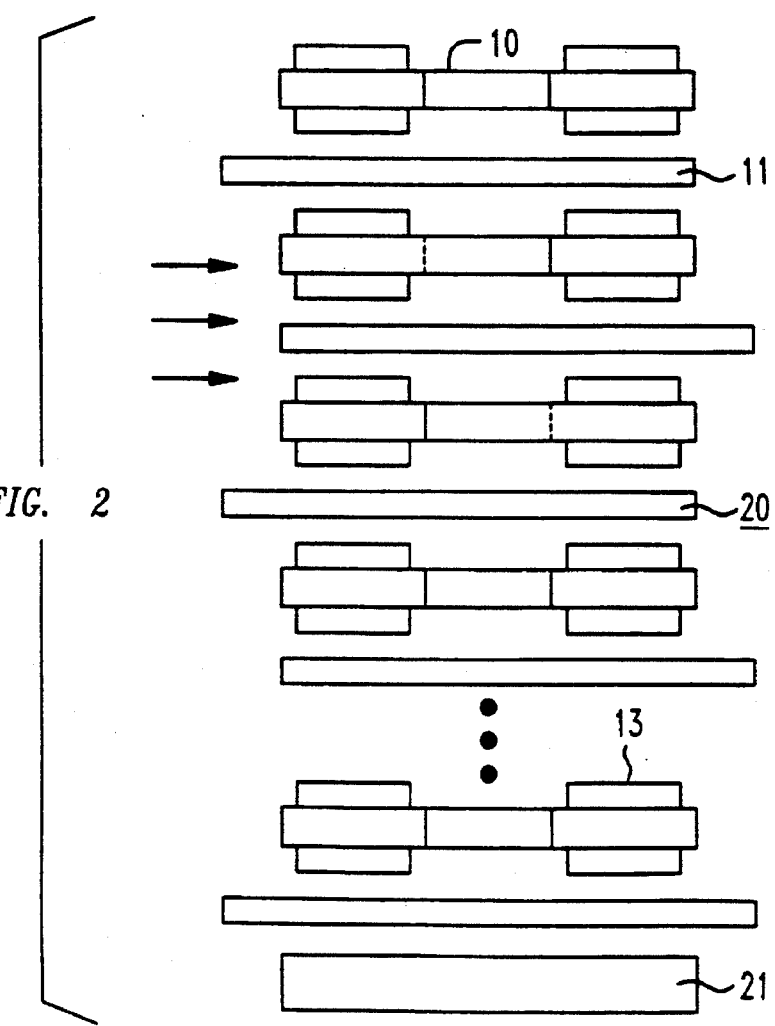
FIG. 2 is a schematic side view of a set of wafers and electrodes in their pre-assembled stage.

Each wafer is provided with a metal layer of, for example nickel, denoted 13. The actuator of the present invention comprises a stack 20 of wafers 10 shown in FIGS. 2 and 4. Separating each adjacent set of wafers is an electrode 11, shown in FIG. 6 as having a contact tab 14 and a cutout 15. The electrode advantageously is a solid disc approximating the size of the wafer without any perforations or slottings thereby to avoid any crevices in which excessive amounts of epoxy might collect.

Advantageously, the electrodes are coated to a thickness of 10 microns with gold to improve electrical connection, reliability, and ease of soldering the electrode tabs together. Electrode 11 may, for example, be made of brass which tends to provide greater stiffness, or beryllium copper. The stacks are contained within two end caps 21.

The glueline (the zone of epoxy disposed between the wafers to rigidify and bond the stack) is affected by the surface roughness of the wafers. Since the epoxy is inherently soft, the glueline thickness should be minimized. This consideration, as well as wanting to minimize the contact stiffness, both argue for the cut wafer surface to be as smooth as possible. Two drawbacks exist, however, to having the surface too smooth: first, the metallization does not adhere as well on too smooth a surface; and second, lapping to achieve smoothness is a relatively high cost step that also exposes the parts to damage and yield reduction.

The selection of a bonding agent and the manner of applying the agent are both critically important in building large diameter, high-stiffness stacked disc actuators for extremely high power output. A bonding agent such as an epoxy must be sufficiently low in viscosity in order to permit the agent to flow from and within the interstices between the adjacent discs while the actuator is under load during the curing process. The maximum allowed viscosity generally is determined by the geometry of the glue layer, the magnitude of the applied force, temperature, and the time to the onset of curing.

The geometry of the glueline is such that as the glue layer area increases, a lower viscosity glue is needed so that the glue will have enough time to flow to the edge of the glue layer area before the onset of curing. Also, because the final glue layer must be extremely thin (less than $0.15 \times 10^{-3}$ inches thick for a stack using wafers with a thickness of 0.020"), the glue must be low in viscosity to overcome this flow-restricting environment.

The magnitude of the force applied during assembly when the glue is curing must be increased if the viscosity of the glue layer is increased, in order to ensure that the flow of the glue is complete before the onset of curing.

The temperature at which the glue layer must be cured determines the time to the onset of curing. As temperature increases, the time to onset of curing decreases. Temperature also directly affects the viscosity of the glue layer. Viscosity decreases with increasing temperature. The selection of an optimal temperature or temperature variation with time is determined by the tradeoff between decreased viscosity with increasing temperature and decreased cure time with increasing temperature.

The maximum allowable viscosity may be determined by the following equation:

$$\text{Viscosity}_{Max} = \frac{FtTl}{A} \cdot \frac{C}{T_a} . \tag{1}$$

Where F is the applied force, t is the time to onset of curing, T is temperature, l is the thickness of the glue layer, A is the area of the glue layer, C is a constant, and $T_a$ is an activation temperature.

All of the variables in the equation above are either fixed or subject to certain maximums. The applied force (F) is limited to a value that would not depolarize a PMN actuator. The time to onset of curing (t) and the temperature (T) are fixed by the recommendations of the epoxy manufacturer. The thickness of the glue layer (l) is fixed by the design requirements of the actuator, which in accordance with the invention must be extremely thin to achieve high power output.

It has been found that a surface roughness of substantially 15 microns, and a permissible roughness range of from 5 to 20 microns provides a good composite result and produces a glueline of 0.1 mil typically. Also, by not resorting to lapping, the use of thinner (i.e., 18 mil) wafers is made possible which in turn produces the desired higher output from the actuator for a given voltage.

The slices are metallized using a pre-existing general process known as "jet vapor deposition" which has been found to be particularly advantageous for producing metallization on the elements.

By way of background, it is desirable that metallization of the wafers for the stacks provide a solid, non-porous surface. One prior art approach uses a metal-containing silver paint which is porous. If only a few wafer-to-wafer interfaces in a stack are needed, the paint does not pose a problem. With many (up to 100 or more) interfaces, the paint porosity causes unacceptable softness which defeats the objective of high mechanical stiffness in the stack assembly. This and other metallization processes of the prior art suffer from this adverse result. Further, many processes also deposit the metal in such a way that the surface roughness of the wafer is or can be actually increased, a disadvantage in the present application.

In accordance with the invention, the jet vapor deposition process described fully in U.S. Pat. No. 4,788,082, hereby incorporated by reference, is used. This process has been found to have the unexpected advantage in the realization of the invention of laying down a metal layer that conforms to any starting point surface roughness. Thus, the surface roughness may be controlled basically by the sawing process described above. The preferred metallization steps will neither make the surface significantly more or significantly less smooth.

Some plating operations may have a tendency to deposit small nodules of nickel on the wafer surfaces. If these nodules are left in place they will increase the glueline thickness. Therefore, to reduce this height, the plated wafers advantageously should be burnished lightly. Experience has shown that burnishing produces a marked reduction in the glueline thickness. The wafers 10 once metallized must be poled to activate PMN's electrostrictive properties.

Figure 4:
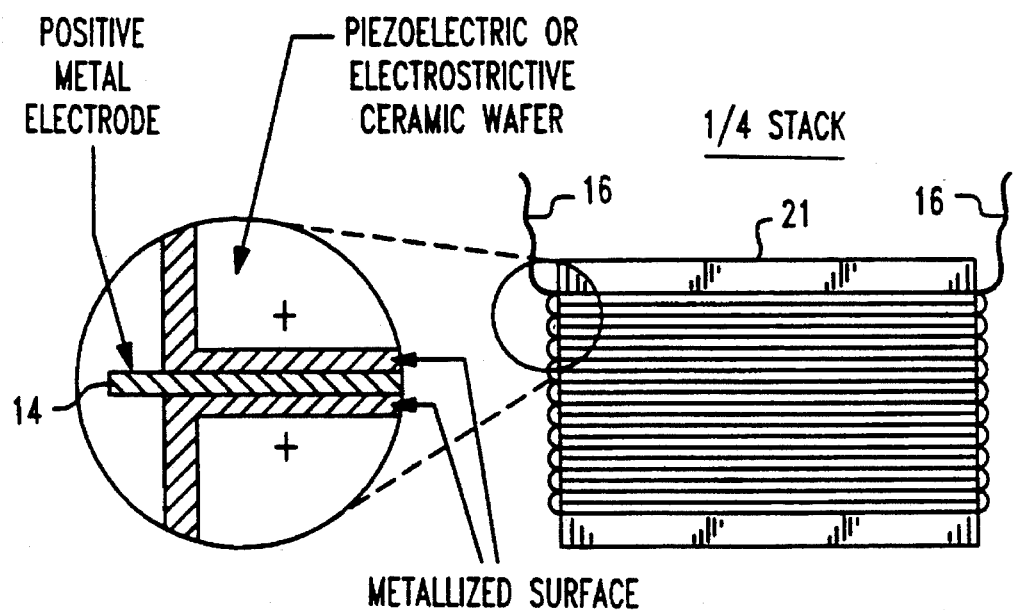
FIG. 4 is a side view diagram of a module of wafers from which the stacks are assembled.
Figure 5:
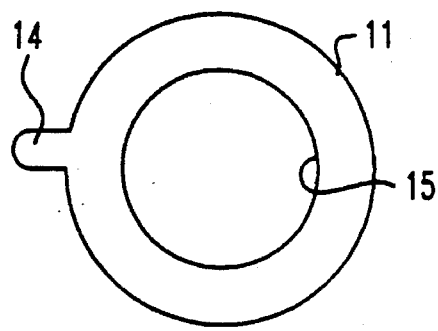
FIG. 5 is a top view of an electrode.

The wafers are assembled into a stack shown in FIG. 4, which is the fundamental unit of the actuator. The wafers may be stacked on a fixture (not shown) which allows the wafers to be maintained in stacked array under a controlled application of opposing axial forces in a clamping action.

A selected type of epoxy is applied to the exterior surfaces of the stack characterized by very low viscosity approaching that of water at room temperatures. Epoxies of selected low viscosity values are readily and surprisingly rapidly guided by capillary action along the surfaces of the contacting wafers, to cover the interface of the wafers, electrodes and end caps. The process also is referred to as "wicking." No wetting agent is necessary.

The epoxy is applied as with a brush or by an automated action. After the wicking has proceeded, the stack is compressed. During this epoxy "wicking" process, a gap of about 0.5 to 1.0 mils between the wafers is formed. To facilitate the capillary action, the stack is preheated to a temperature of about 110 degrees C. After the wicking action is completed in about 10 minutes, the stack is compressed by the application of force to the stack in the neighborhood of 3,500 pounds. This aspect of the invention reduces to a minimum the amount of epoxy that remains between the wafers thereby to avoid decreasing the critically important contact stiffness factor. The epoxy is cured at 110 degrees C. for about 4 hours. The elevated temperature promotes expulsion of the epoxy from the interfaces because of the reduced viscosity of the epoxy at elevated temperatures, as well as hastening the cure time.

The epoxy serves two functions. First, it acts to transfer mechanical forces and second, it holds the stack together during actuator assembly. Since the epoxy is a series spring element in the stack, maximizing its stiffness will increase the stack stiffness. It has been determined that Emerson and Cummings epoxy "W19" with the Catalyst 11 provides highly advantageous results. It exhibits adequate pot life and low viscosity which facilitates the important and inventive "wicking" action. Any excess is readily squeezed from the gap. Other epoxies also fit the requirement.

Figure 3:
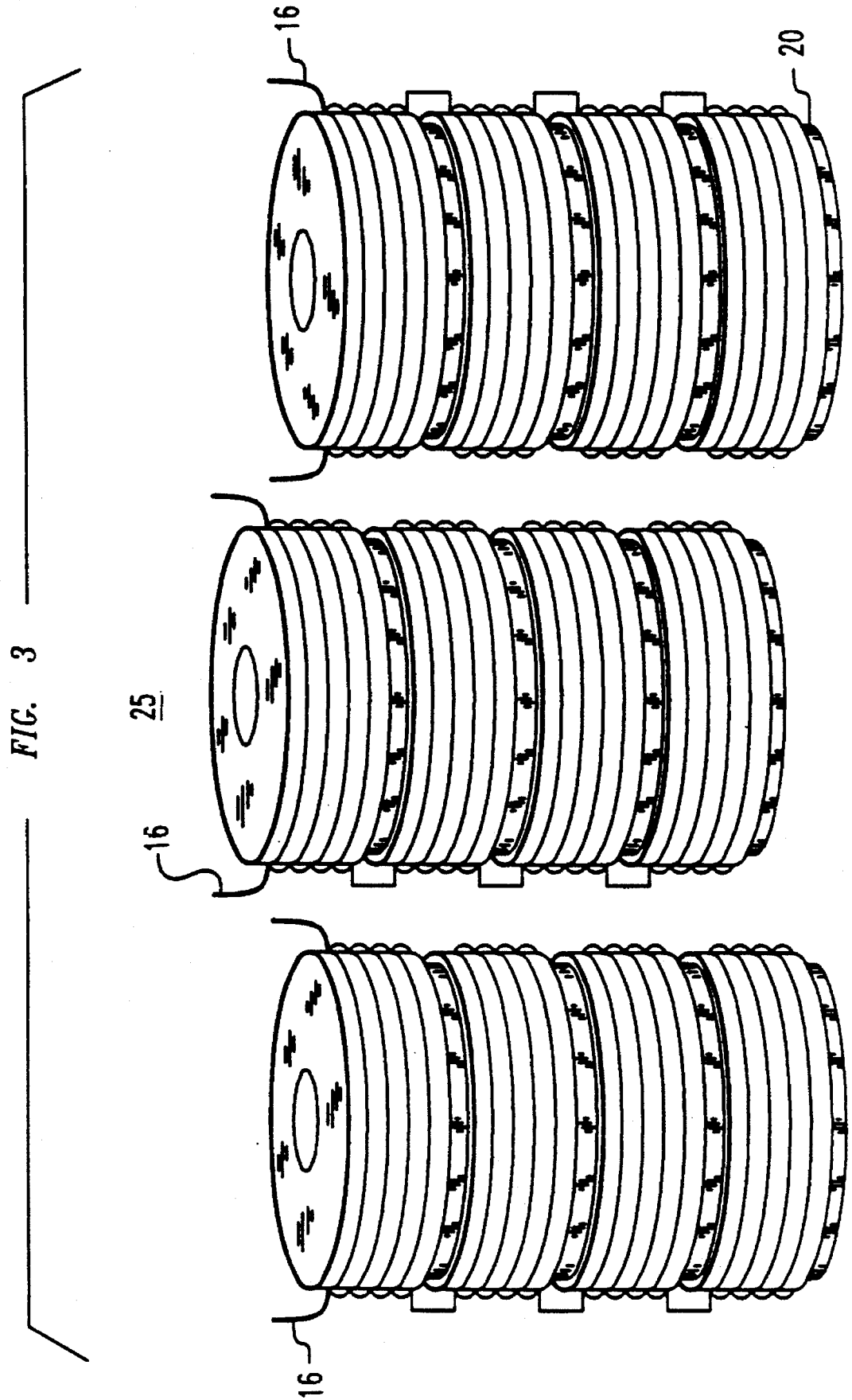
FIG. 3 is a side schematic view of a stack of assembled wafers.

The finished stack may consist of four sets of wafer/electrode components. A set is depicted in FIG. 4. The final force generating actuator is shown in FIG. 3 as comprised of a single stack, denoted 25, of wafers. Each overall stack has, for example, four wafer sets contained within the caps. The electrodes 11 are electrically connected by leads 16. This structure is referred to as a stack. The use of multiple smaller stacks and sets improves the production yield by reducing the losses associated with any defect. Full stacks can be used with some loss of yield.

The result is an actuator that produces nearly an order of magnitude more work output into a matched load than currently available technology. The actuator stack of the invention typically has a stiffness of 3,100,000 lbs./in., a free displacement of 5.1 mils, and a block force of 16,700 lbs. This results in a work output (into a matched impedance) of 20.87 in.-lbs.

Figure 6:
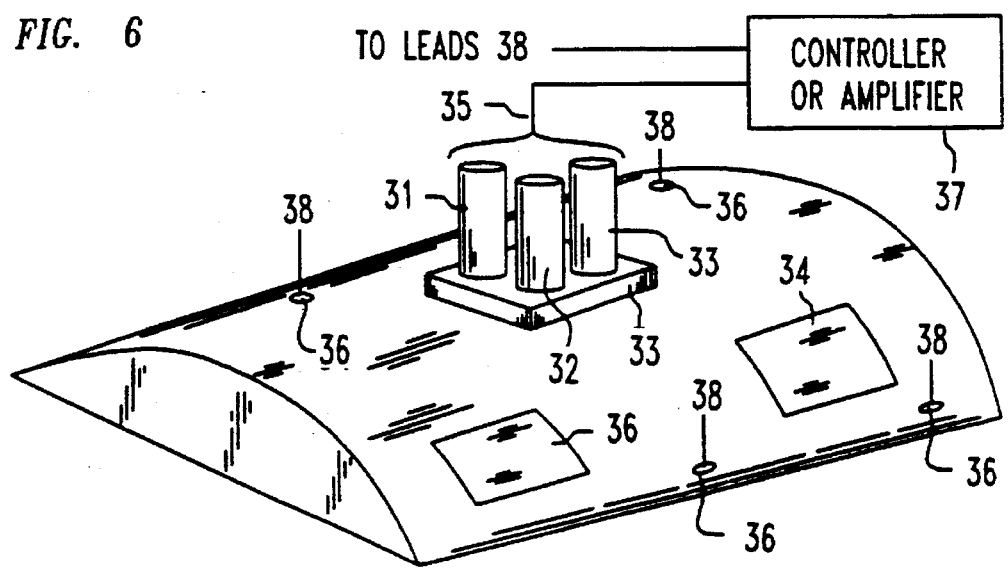
FIG. 6 is a schematic diagram of an exemplary use of the product made from the processes described showing actuators in a system to control vibration.

FIG. 6 schematically illustrates the use of the invention to reduce a generalized surface denoted 30. The stack is conventionally mounted on a platform 34 that is attached drivably to surface 30. Connections 38—38 provide control and power leads from the tabs 16 of the stacks to a power amplifier 50. Although three stacks are shown for sake of illustration, any number can be utilized to drive each platform depending on the application.

In summary, a higher output force for a given cross-section is achieved. Higher output displacement and higher resonant frequency are also achieved, increasing the useful range of frequencies at which the actuator may be operated. Improved fabrication yield is achieved. The option of being able to use thinner wafers is offered, which either lowers the required drive voltage or boosts the actuator output for a given voltage.

Workers in the art will appreciate that amplifier 50 may be driven by a controller (not shown) which, for example, contains computer-based processes for responding to signals from sensors such as sensors 36 located on the surface 30 and connected to the controller of vibration control system, well-known in the art, can be improved by use of the actuators of the invention.

We claim:

1. A piezoelectric, transductive element made by a process that comprises:
    a) sawing a ceramic boule into wafer discs, such that each of the resulting wafer discs has a surface roughness in the range 5–20 μm;
    b) coating both sides of each said disc with a conductive metal in a process that does not substantially change said surface roughness;
    c) arranging a multiplicity of said wafer discs in a stack with an electrode disc interposed between each pair of successive wafer discs;
    d) applying to the exterior of the stack, a curable adhesive of a viscosity low enough to permit penetration of the stack;
    e) permitting the adhesive to flow by capillary action into the interstitial spaces between each wafer disc and the adjacent electrode discs;
    f) compressing the stack to expel excess adhesive such that after curing, all glue lines that form between adjacent wafer discs will be less than $0.15 \times 10^{-3}$ inch in thickness; and
    g) curing the adhesive.

2. Apparatus of claim 1, wherein the adhesive comprises an epoxy resin.

3. Apparatus of claim 1, wherein the metal-coating step is performed by jet vapor deposition.

4. Apparatus of claim 1, wherein the ceramic boule is formed from a lead-magnesium-niobate system, and the conductive metal coating comprises nickel.

* * * * *